United States Patent
Kawamura et al.

(10) Patent No.: US 10,888,941 B2
(45) Date of Patent: Jan. 12, 2021

(54) POWER SEMICONDUCTOR MODULE (71) Applicant: Hitachi Power Semiconductor Device, Ltd., Ibaraki (JP)

(72) Inventors: Daichi Kawamura, Tokyo (JP); Toru Masuda, Tokyo (JP); Junpei Kusukawa, Tokyo (JP); Naoki Sakurai, Tokyo (JP)

(73) Assignee: HITACHI POWER SEMICONDUCTOR DEVICE, LTD., Ibaraki (JP)

( * ) Notice: Subject to any disclaimer, the term of this patent is extended or adjusted under 35 U.S.C. 154(b) by 0 days.

(21) Appl. No.: 16/168,857

(22) Filed: Oct. 24, 2018

(65) Prior Publication Data
US 2019/0126374 A1 May 2, 2019

(30) Foreign Application Priority Data

Oct. 27, 2017 (JP) .................. 2017-207902

(51) Int. Cl.
*H01L 23/60* (2006.01)
*H01L 23/24* (2006.01)
(Continued)

(52) U.S. Cl.
CPC .............. *B23K 1/20* (2013.01); *B23K 35/025* (2013.01); *H01L 23/053* (2013.01); *H01L 23/24* (2013.01); *H01L 23/36* (2013.01); *H01L 23/3735* (2013.01); *H01L 23/49811* (2013.01); *H01L 23/60* (2013.01); *H01L 24/33* (2013.01); *H01L 25/072* (2013.01); *H01L 25/18* (2013.01); *H05K 3/34* (2013.01); *B23K 35/02* (2013.01); *B23K 35/3602* (2013.01); *H01L 24/29* (2013.01); *H01L 24/32* (2013.01); *H01L 24/48* (2013.01); *H01L 24/73* (2013.01); *H01L 2224/291* (2013.01); *H01L 2224/32225* (2013.01); *H01L 2224/48091* (2013.01);
(Continued)

(58) Field of Classification Search
CPC ....................................................... H01L 23/24
See application file for complete search history.

(56) References Cited

U.S. PATENT DOCUMENTS 6,504,110 B1 * 1/2003 Kusukawa ............... H05K 3/22
174/261
2008/0206928 A1 8/2008 Onishi et al.
(Continued)

FOREIGN PATENT DOCUMENTS

JP 2008-207207 A 9/2008

*Primary Examiner* — Omar F Mojaddedi
(74) *Attorney, Agent, or Firm* — Mattingly & Malur, PC (57) ABSTRACT

When a distance between an end portion of a brazing material and a downward extended line of a side surface of an insulating substrate is taken as "a", and a distance between an end portion of a solder resist on the side of a solder and the downward extended line of the side surface of the insulating substrate is taken as "b", the positional relationship a<b is satisfied. The position of the end portion of the solder is regulated by the solder resist, and the position of the end portion of the brazing material on the side of the side surface of the insulating substrate is closer to the side of the side surface of the insulating substrate than to the position of the end portion of the solder on the side of the side surface of the insulating substrate.

13 Claims, 5 Drawing Sheets

(51) Int. Cl.
*H01L 23/053* (2006.01)
*H01L 23/373* (2006.01)
*H01L 25/07* (2006.01)
*H01L 25/18* (2006.01)
*B23K 1/20* (2006.01)
*B23K 35/36* (2006.01)
*H05K 1/03* (2006.01)
*H05K 3/38* (2006.01)
*H05K 3/34* (2006.01)
*H01L 23/36* (2006.01)
*B23K 35/02* (2006.01)
*H01L 23/498* (2006.01)
*H01L 23/00* (2006.01)

(52) U.S. Cl.
CPC ............... *H01L 2224/48227* (2013.01); *H01L 2224/48491* (2013.01); *H01L 2224/73265* (2013.01); *H01L 2924/00014* (2013.01); *H01L 2924/13055* (2013.01)

(56) References Cited

U.S. PATENT DOCUMENTS

| | | | |
|---|---|---|---|
| 2013/0135824 A1* | 5/2013 | Harubeppu | H01L 23/34 361/709 |
| 2014/0126155 A1* | 5/2014 | Imamura | H01L 23/34 361/715 |
| 2017/0271274 A1* | 9/2017 | Hinata | H01L 23/562 |

* cited by examiner

POWER SEMICONDUCTOR MODULE

CROSS-REFERENCE TO RELATED APPLICATION

The present application claims priority from Japanese application JP 2017-207902, filed on Oct. 27, 2017, the contents of which is hereby incorporated by reference into this application.

BACKGROUND OF THE INVENTION

1. Field of the Invention

The present invention relates to a power semiconductor module which suppresses corona discharge to improve insulation reliability.

2. Description of the Related Art

A power converter (converter, inverter) equipped with a power semiconductor module is widely used in various fields such as railways, automobiles, industries, electric power, and social infrastructure. High insulation reliability is required for a power semiconductor module treating a high voltage.

The outer periphery part of the power semiconductor module is insulated by the creeping surface of air and an insulator, whereby a space distance and a creeping distance are defined by the standard (for example IEC60664) so as not to cause a short circuit or discharge in a predetermined environment.

The increase of the space distance and the creeping distance makes it difficult to secure insulation properties in a module in which a power semiconductor chip, an insulating substrate, and a bonding wire and the like are mounted at high density, whereby internal mounting members are sealed with an insulating resin to achieve the insulation between the members.

As an insulating resin material for sealing the inside of the module, for example, a soft resin such as a silicone gel is generally used in a large-capacity power semiconductor module having a rated current of 100 amperes or more.

In the power semiconductor module, a solder, a back surface electrode, a brazing material, an insulating substrate, and a semiconductor chip are sequentially mounted on a metal base, and disposed in an insulating case. The insulating case is filled with an insulating resin, which achieves the insulation between the members.

Herein, a region between the insulating substrate and the metal base is narrow, but the solder tends to wet and spread on the surface of the metal base. Solder flow occurs, which may cause a narrow void to be formed between the insulating substrate and the solder. The region between the insulating substrate and the metal base is narrow, but the region between the insulating substrate and the solder is further narrow.

For this reason, the region between the insulating substrate and the solder is not filled with the insulating resin, which may cause a void to occur. Corona discharge may occur in the void.

Therefore, in the technique described in JP 2008-207207 A, the upper surface of a metal base is irradiated with a laser, to form a metal oxide film, thereby suppressing solder flow.

SUMMARY OF THE INVENTION

However, in the technique described in JP 2008-207207 A, considering the variation in the mounting position accuracy (the positional accuracy in the direction parallel to the surface of the insulating substrate) of the insulating substrate on the metal base, the metal oxide film is formed at a position separated by a predetermined distance from a position corresponding to an insulating substrate mounting region. For this reason, a considerable amount of solder flow occurs up to the metal oxide film, whereby a region having a narrow width between the insulating substrate and the solder appears, and a void which is not filled with the insulating resin is formed in the region having a narrow width. Corona discharge may disadvantageously occur in the void.

The present invention has been made in view of the above-described problems of the prior art, and it is an object of the present invention to realize a power semiconductor module which can suppress the occurrence of corona discharge even when a void occurs below an insulating substrate and has improved reliability.

In order to achieve the above object, the present invention is configured as follows.

A power semiconductor module includes: an insulating substrate; a front surface electrode and a back surface electrode respectively fixed to a front surface and a back surface of the insulating substrate with a front surface brazing material interposed between the front surface electrode and the insulating substrate and a back surface brazing material interposed between the back surface electrode and the insulating substrate; a power semiconductor chip connected to the front surface electrode with a front surface solder interposed between the power semiconductor chip and the front surface electrode; a back surface solder formed on a surface of the back surface electrode opposite to a side of the insulating substrate; a metal base on which the back surface solder is disposed to fix the back surface electrode with the back surface solder interposed between the metal base and the back surface electrode; a solder flow resistance portion formed on a surface on which the back surface solder of the metal base is disposed; an insulating case housing the insulating substrate, the front surface electrode, the back surface electrode, the power semiconductor chip, and the metal base; and an insulating resin filled in the insulating case. The insulating substrate, the front surface solder, the front surface electrode, the back surface brazing material, the back surface electrode, and the back surface solder are stacked in a vertical direction, and a difference between a position in a lateral direction of an end portion of the back surface brazing material and a position in a lateral direction of an end portion of the insulating substrate is smaller than a difference between a position of an end portion of the solder flow resistance portion facing an end portion of a lateral direction of the back surface solder and the position in the lateral direction of the end portion of the insulating substrate.

The present invention makes it possible to realize the power semiconductor module which can suppress the occurrence of corona discharge even when the void occurs below the insulating substrate and has improved insulation reliability.

DESCRIPTION OF THE PREFERRED EMBODIMENTS

Hereinafter, a power semiconductor module of the present invention will be described based on illustrated Examples. In each of Examples, the same reference numerals are used for the same components.

EXAMPLES

Example 1

Figure 1:
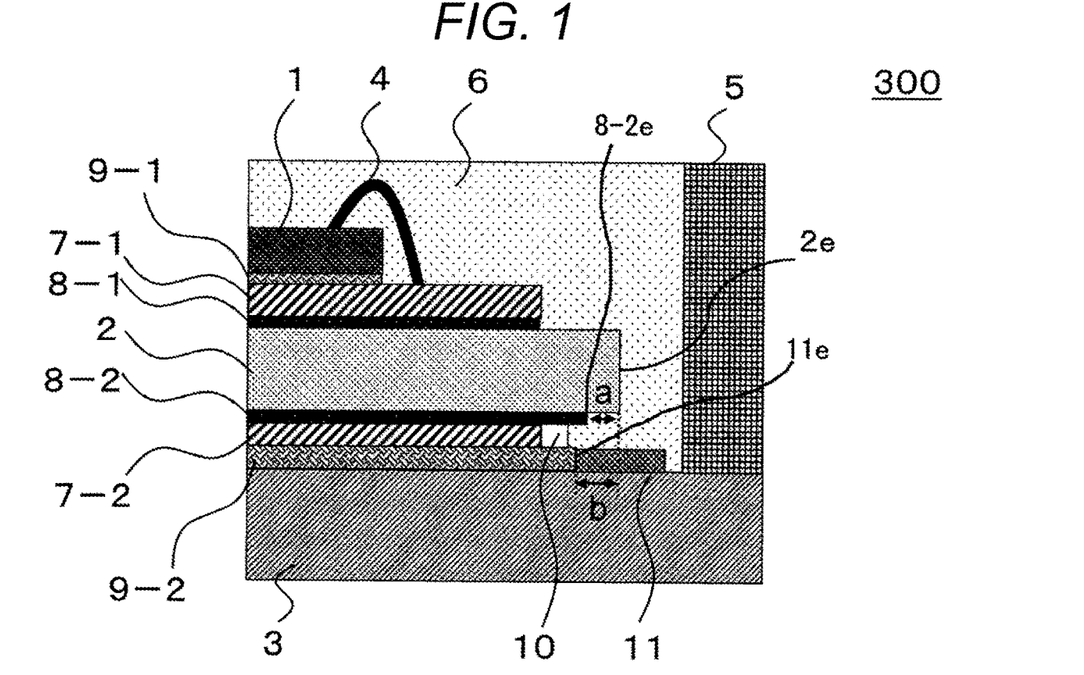
FIG. 1 is a diagram illustrating the main part of a power semiconductor module according to Example 1.

FIG. 1 is a diagram illustrating the main part of a power semiconductor module according to Example 1.

Prior to the description of Example 1, a power semiconductor module to which the present invention is applied will be described.

Figure 8:
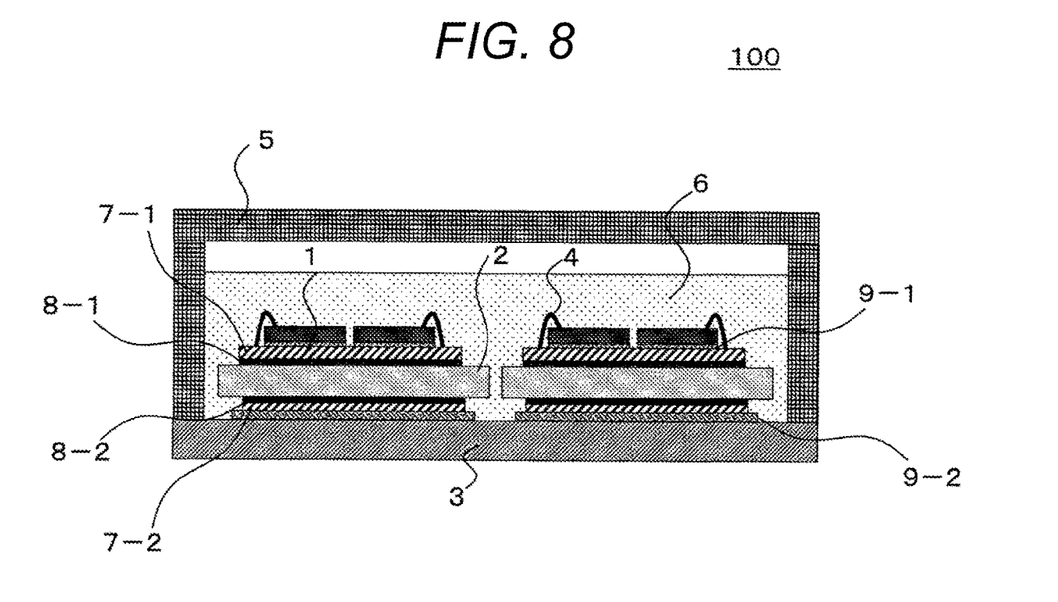
FIG. 8 is a diagram illustrating the schematic structure of a power semiconductor module to which the present invention is applied.

FIG. 8 is a diagram illustrating the schematic structure of a power semiconductor module to which the present invention is applied. In FIG. 8, the power semiconductor module includes a power semiconductor chip 1 such as an insulated gate bipolar transistor (IGBT) or a metal oxide semiconductor (MOS), an insulating substrate 2, a metal base 3, a bonding wire 4, an insulating case 5, and a silicone gel 6 as an insulating sealing material, and the like.

A front surface electrode 7-1 is bonded to one surface of the insulating substrate 2 by a brazing material 8-1, and a back surface electrode 7-2 is bonded to the other surface of the insulating substrate 2 by a brazing material 8-2. The power semiconductor chip 1 is bonded to the front surface electrode 7-1 by a solder 9-1, and the back surface electrode 7-2 and the metal base 3 are bonded by a solder 9-2. The insulating case 5 is connected to the periphery of the metal base 3 by an adhesive, and the silicone gel 6 is sealed in the insulating case 5.

Next, Example 1 will be described with reference to FIG. 1.

In FIG. 1, a power semiconductor module 300 of Example 1 includes a power semiconductor chip 1, an insulating substrate 2, a metal base 3, a bonding wire 4, an insulating case 5, a silicone gel 6 as an insulating sealing material, and a solder resist 11. A front surface electrode 7-1 is bonded to one upper surface of the insulating substrate 2 by a front surface brazing material 8-1, and a back surface electrode 7-2 is bonded to the other lower surface (the other surface) of the insulating substrate 2 by a back surface brazing material 8-2. The power semiconductor chip 1 is bonded onto the front surface electrode 7-1 by a front surface solder 9-1, and the metal base 3 is bonded to the surface of the back surface electrode 7-2 opposite to the side of the insulating substrate 2 with a solder 9-2 interposed between the back surface electrode 7-2 and the metal base 3.

The power semiconductor chip 1 and the front surface electrode 7-1 of the insulating substrate 2 are connected by the bonding wire 4, and the insulating case 5 is connected to the periphery of the metal base 3 by an adhesive (not shown). The silicone gel 6 is sealed in the insulating case 5. The insulating case 5 houses at least the insulating substrate 2, the front surface electrode 7-1, the back surface electrode 7-2, the power semiconductor chip 1, and the metal base 3.

The solder resist 11 is formed along the outer periphery of an insulating substrate mounting region on the upper surface of the metal base 3. Herein, each of both the potentials of the brazing material 8-2 and the solder 9-2 is a GND potential (ground potential).

An end portion 8-2e of the brazing material 8-2 for bonding the insulating substrate 2 and the insulating substrate back surface electrode 7-2 protrudes to the direction of a side surface 2e of the insulating substrate 2 (the direction parallel to the front surface (back surface) of the insulating substrate 2) with respect to an end portion 11e of the solder resist 11 on the side of the back surface solder 9-2 (also the end portion of the solder 9-2.

That is, when the distance between the end portion 8-2e of the brazing material 8-2 and the downward extended line of the side surface 2e of the insulating substrate 2 is taken as "a", and the distance between the end portion 11e of the solder resist 11 on the side of the solder 9-2 and the downward extended line of the side surface of the insulating substrate 2 is taken as "b", the positional relationship (a<b) is satisfied.

In other words, the insulating substrate 2, the brazing material 8-2, the back surface electrode 7-2, and the solder 9-2 are stacked in a vertical direction in FIG. 1, and the difference a between the position in the lateral direction of the end portion 8-2e of the brazing material 8-2 and the position in the lateral direction of the end portion (side surface 2e) of the insulating substrate 2 is smaller than the difference b between the position in the lateral direction of the end portion 11e of the solder 9-2 and the position in the lateral direction of the end portion (side surface 2e) of the insulating substrate 2 (the difference a between the position in the lateral direction of the end portion of the back surface brazing material 8-2 and the position in the lateral direction of the end portion of the insulating substrate 2 is smaller than the difference b between the position of the end portion of the solder resist 11 as a solder flow resistance portion facing the end portion in the lateral direction of the back surface solder 7-2 and the portion in the lateral direction of the end portion of the insulating substrate 2).

When the solder 9-2 for bonding the back surface electrode 7-2 of the insulating substrate 2 and the metal base 3 flows in the direction of the side surface of the insulating substrate 2 (the left direction in FIG. 1), and reaches a place where the solder resist 11 is formed, the flow of the solder 9-2 is suppressed. The end portion 8-2e of the brazing material 8-2 protrudes to the direction of the side surface of the insulating substrate 2 with respect to the end portion 11e of the solder resist 11 on the side of the solder 9-2, whereby the end portion 8-2e of the brazing material 8-2 protrudes to the direction of the side surface of the insulating substrate 2 also with respect to the end portion of the solder 9-2.

The region between the solder 9-2 and the insulating substrate 2 in the vertical direction has a narrow width, whereby a void 10 may be formed in the region between the solder 9-2 and the insulating substrate 2 in the vertical direction.

In the present invention, the upper and lower portions of the void 10 are configured to be sandwiched between the solder 9-2 and the brazing material 8-2 having the same GND potential. Accordingly, no voltage is applied to the void 10. Therefore, even when the void 10 is formed, corona discharge at the place can be suppressed.

Unlike Example 1, when the end portion 11*e* of the solder resist 11 on the side of the solder 9-2 protrudes to the direction of the side surface of the insulating substrate 2 with respect to the end portion 8-2*e* of the brazing material 8-2 in the direction of the side surface of the insulating substrate 2 (a>b), a void may occur between the insulating substrate 2 and the solder 9-2 without the brazing material 8-2 being interposed therebetween, which may cause corona discharge to occur in the void.

The positional relationship between the brazing material 8-2 and the solder resist 11 shown in FIG. 1 can be adjusted in the manufacturing process of the power semiconductor module 300.

As described above, according to Example 1, the position of the end portion of the solder 9-2 is regulated by the solder resist 11, and the end portion 8-2*e* of the brazing material 8-2 on the side of the side surface of the insulating substrate 2 is closer to the side of the side surface of the insulating substrate 2 than to the end portion of the solder 9-2 on the side of the side surface of the insulating substrate 2.

Therefore, even if a void occurs between the brazing material 8-2 and the solder 9-2, each of both the potentials of the brazing material 8-2 and the solder 9-2 is a ground level, whereby the occurrence of corona discharge can be suppressed.

That is, the power semiconductor module can be realized, which can suppress the occurrence of the corona discharge even when the void occurs below the insulating substrate, and has improved insulation reliability.

Example 2

Next, Example 2 will be described.

Figure 2:
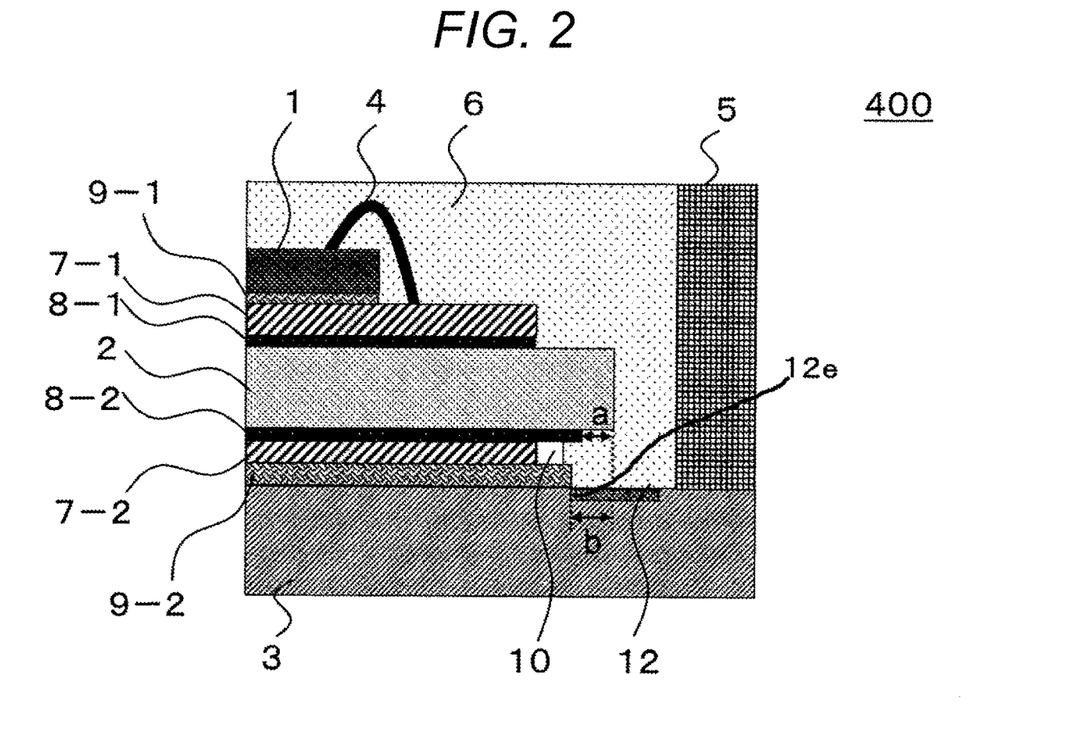
FIG. 2 is a diagram illustrating the main part of a power semiconductor module according to Example 2.

FIG. 2 is a diagram illustrating the main part of a power semiconductor module 400 of Example 2.

In FIG. 2, in the power semiconductor module 400 of Example 2, a portion suppressing the solder flow of a solder 9-2 bonding an insulating substrate back surface electrode 7-2 and a metal base 3 is not the solder resist 11 of Example 1 but a metal oxide film 12 as compared with the power semiconductor module 300 of Example 1. The other configurations in Example 2 are substantially similar to those of Example 1.

The metal oxide film 12 is formed on the upper surface of the metal base 3 including the outer peripheral region of the extended line of the side surface of an insulating substrate 2. AlSiC or Cu is used as the base material of the metal base 3, and in order to improve solder wettability, the base material of the metal base 3 is plated using, for example, Ni and the like. For example, a plating material is irradiated with a laser beam to oxidize the plating material, thereby forming the metal oxide film 12.

As described above, the solder 9-2 bonds the back surface electrode 7-2 of the insulating substrate 2 and the metal base 3. When the power semiconductor module 400 is manufactured, the solder 9-2 flows in the direction of the side surface of the insulating substrate 2, and reaches a place where the metal oxide film 12 is formed, the flow of the solder 9-2 is suppressed.

An end portion 8-2*e* of a brazing material 8-2 protrudes to the direction of the side surface of the insulating substrate 2 (the direction parallel to the front surface (back surface) of the insulating substrate 2) with respect to an end portion 12*e* of the metal oxide film 12 on the side of the solder 9-2.

That is, as with Example 1, when the distance between the end portion 8-2*e* of the brazing material 8-2 and the downward extended line of the side surface of the insulating substrate 2 is taken as "a", and the distance between the end portion 12*e* of the metal oxide film 12 on the side of the solder 9-2 and the lower extended line of the side surface of the insulating substrate 2 is taken as "b", the positional relationship (a<b) is satisfied.

A void 10 may be formed in a region between the solder 9-2 and the insulating substrate 2 in a vertical direction. In Example 2, as with Example 1, the upper and lower portions of the void 10 are sandwiched between the brazing material 8-2 and the solder 9-2 having the same GND potential, whereby no voltage is applied to the void 10. Therefore, even when the void 10 is formed, corona discharge at the place can be suppressed.

As described above, according to Example 2, the same effect as that of Example 1 can be obtained, and the metal oxide film 12 is formed by using the laser beam, whereby an effect of improving the positional accuracy of the metal oxide film 12 is provided.

Example 3

Next, Example 3 will be described.

Figure 3:
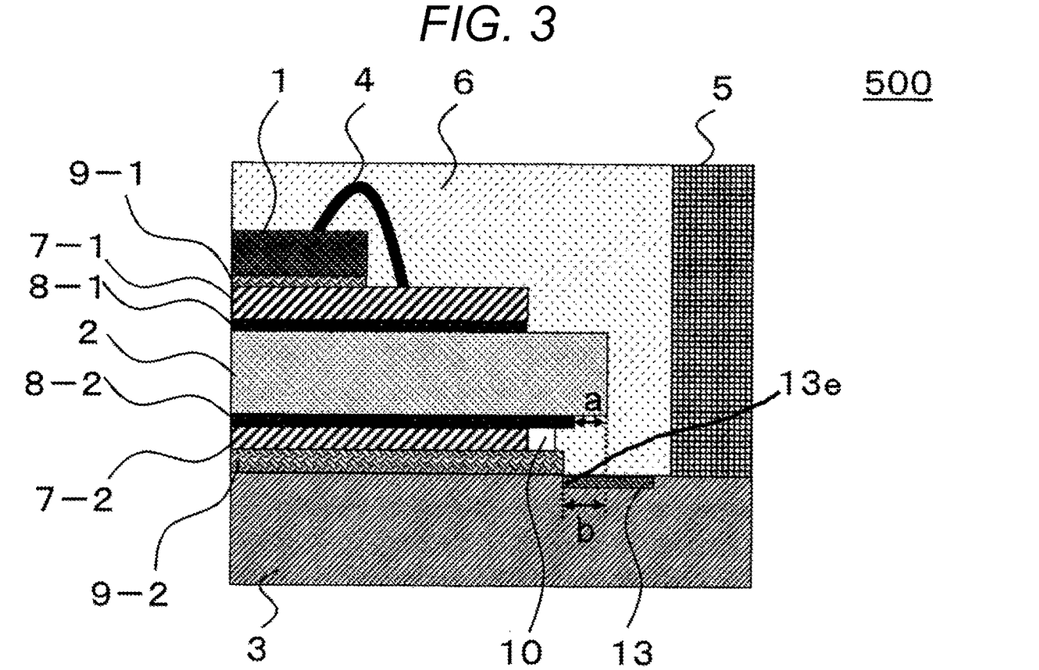
FIG. 3 is a diagram illustrating the main part of a power semiconductor module according to Example 3.

FIG. 3 is a diagram illustrating the main part of a power semiconductor module 500 of Example 3.

In FIG. 3, in the power semiconductor module 500 of Example 3, a portion suppressing the solder flow of a solder 9-2 bonding an insulating substrate back surface electrode 7-2 and a metal base 3 is not the solder resist 11 of Example 1 but a non-plated portion 13 as compared with the power semiconductor module 300 of Example 1. The other configurations in Example 3 are substantially the same as those in Example 1.

As described above, AlSiC or Cu is used for the base material of the metal base 3, and in order to improve solder wettability, the base material of the metal base 3 is plated using Ni and the like. The non-plated portion 13 is formed on the upper surface of the metal base 3 including the outer peripheral region of the extended line of the side surface of the insulating substrate 2. The front surface of the metal base 3 is plated, and then subjected to a plating removing treatment to form the non-plated portion 13.

The solder 9-2 flows in the direction of the side surface of the insulating substrate 2 when the power semiconductor module 500 is manufactured, but the non-plated portion 13 has poor solder wettability, whereby the flow of the solder 9-2 is suppressed by an end portion 13*e* of the non-plated portion 13.

An end portion 8-2*e* of a brazing material 8-2 protrudes to the direction of the side surface of the insulating substrate 2 (the direction parallel to the front surface (back surface) of the insulating substrate 2) with respect to the end portion 13*e* of the non-plated portion 13 on the side of the solder 9-2.

That is, as with Example 1, the distance between the end portion 8-2*e* of the brazing material 8-2 and the downward extended line of the side surface of the insulating substrate 2 is taken as "a", and the distance between the end portion 13*e* of the non-plated portion 13 on the side of the solder 9-2 and the downward extended line of the side surface of the insulating substrate 2 is taken as "b", the positional relationship (a<b) is satisfied.

A void 10 may be formed in a region between the solder 9-2 and the insulating substrate 2 in a vertical direction. In Example 3, as with Example 1, the upper and lower portions of the void 10 are sandwiched between the brazing material 8-2 and the solder 9-2 having the same GND potential, whereby no voltage is applied to the void 10. Therefore, even when the void 10 is formed, corona discharge at the place can be suppressed.

As described above, according to Example 3, the same effect as that of Example 1 can be obtained.

Example 4

Next, Example 4 will be described.

Figure 4:
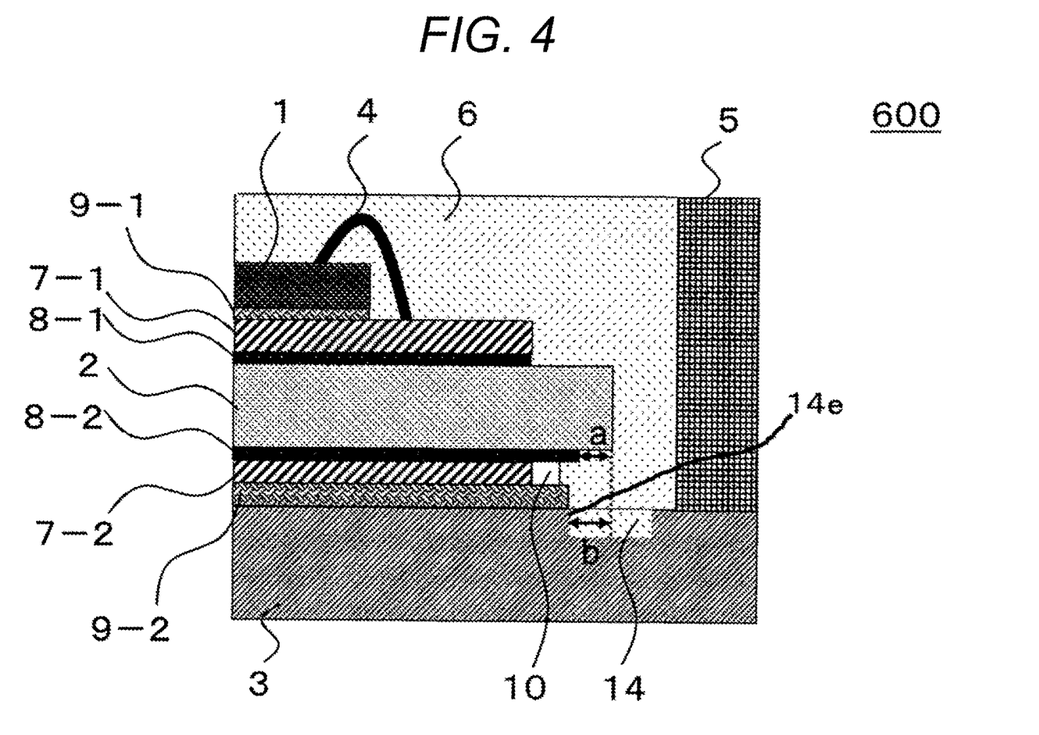
FIG. 4 is a diagram illustrating the main part of a power semiconductor module according to Example 4.

FIG. 4 is a diagram illustrating the main part of a power semiconductor module 600 of Example 4.

In FIG. 4, in the power semiconductor module 600 of Example 4, a portion suppressing the solder flow of a solder 9-2 bonding an insulating substrate back surface electrode 7-2 and a metal base 3 is not a solder resist 11 but a metal base recessed portion 14 as compared with the power semiconductor module 300 of Example 1. The other configurations in Example 4 are substantially similar to those of Example 1. The metal base recessed portion 14 can be formed by mechanical processing.

The metal base recessed portion 14 is formed on the metal base 3 including the outer peripheral region of the extended line of the side surface of an insulating substrate 2. When the power semiconductor module 600 is manufactured, the solder 9-2 flows in the direction of the side surface of the insulating substrate 2, but the solder flow is suppressed by the metal base recessed portion 14.

An end portion 8-2e of the brazing material 8-2 protrudes to the direction of the side surface of the insulating substrate 2 (the direction parallel to the front surface (back surface) of the insulating substrate 2) with respect to an end portion 14e of the metal base recessed portion 14 on the side of the solder 9-2.

That is, as with Example 1, when the distance between the end portion 8-2e of the brazing material 8-2 and the downward extended line of the side surface of the insulating substrate 2 is taken as "a", and the distance between the end portion 14e of the metal base recessed portion 14 and the downward extended line of the side surface of the insulating substrate 2 is taken as "b", the positional relationship (a<b) is satisfied.

The region between the solder 9-2 and the insulating substrate 2 has a narrow width, whereby a void 10 may be formed in the region. In Example 4, as with Example 1, the upper and lower portions of the void 10 are sandwiched between the brazing material 8-2 and the solder 9-2 having the same GND potential, whereby no voltage is applied to the void 10. Therefore, even when the void 10 is formed, corona discharge at the place can be suppressed.

Example 5

Next, Examples 5 will be described.

Figure 5:
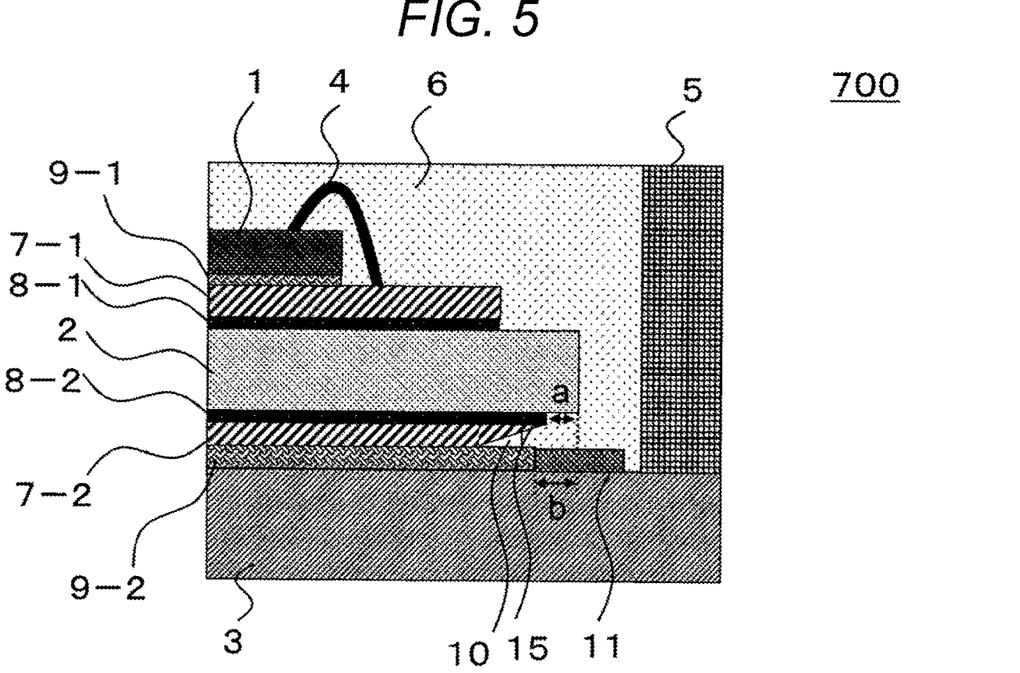
FIG. 5 is a diagram illustrating the main part of a power semiconductor module according to Example 5.

FIG. 5 is a diagram illustrating the main part of a power semiconductor module of Example 5.

In FIG. 5, in a power semiconductor module 700 of Example 5, as with Example 1, a solder resist 11 is formed on the upper surface of a metal base 3. In Example 5, the end portion of a back surface electrode 7-2 is a tapered portion 15 extending to the direction of the side surface of an insulating substrate 2 with respect to an end portion 11e of the solder resist 11.

In the positional relationship between an end portion 8-2e of a brazing material 8-2 and the end portion 11e of the solder resist 11 on the side of a solder 9-2 in Example 5, a is smaller than b as with Example 1.

The region between the solder 9-2 and the insulating substrate 2 has a narrow width, but the end portion of the back surface electrode 7-2 is a tapered portion 15 having a tapered shape, whereby an insulating resin 6 is easily filled, but a void 10 may be formed. However, in Example 5, the upper and lower portions of the void 10 are sandwiched between the tapered portion 15 of the back surface electrode 7-2 and the solder 9-2 having the same ground potential, whereby no voltage is applied to the void 10.

Therefore, even when the void 10 is formed, corona discharge in the void can be suppressed, and in Example 5, the same effect as that of Example 1 can be obtained.

The tapered portion 15 in Example 5 can also be formed on the back surface electrode 7-2 in Examples 2 to 4.

Example 6

Next, Example 6 will be described.

Figure 6:
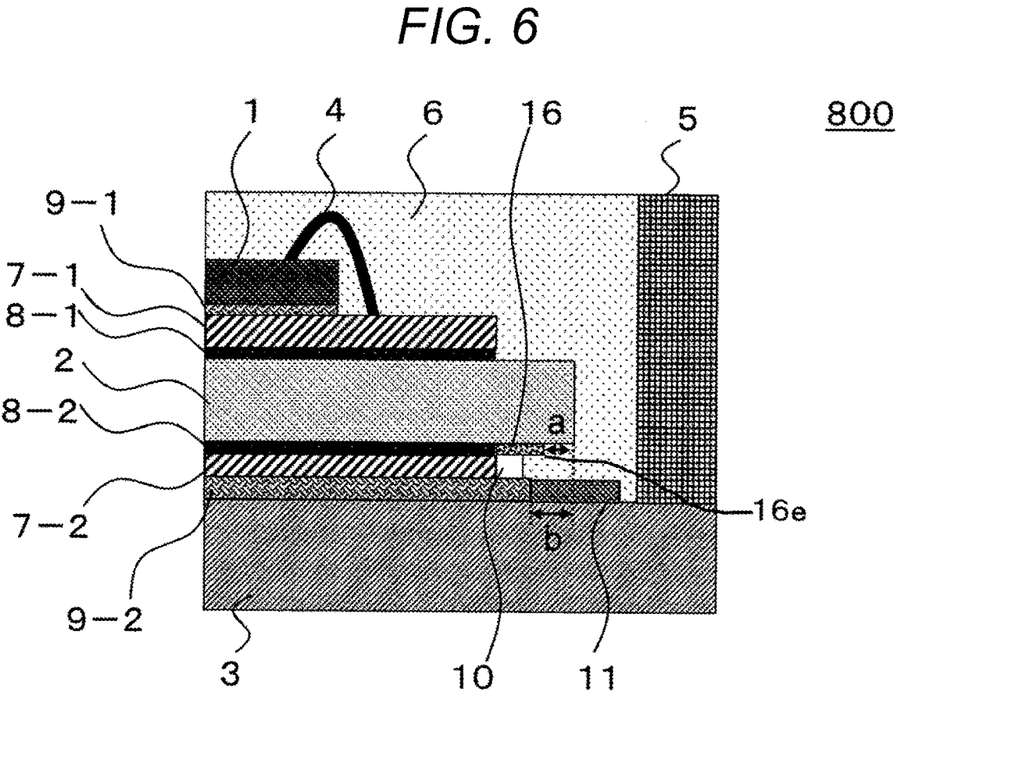
FIG. 6 is a diagram illustrating the main part of a power semiconductor module according to Example 6.

FIG. 6 is a diagram illustrating the main part of a power semiconductor module 800 of Example 6.

In FIG. 6, in the power semiconductor module 800 of Example 6, a conductive paste 16 is applied to the back surface of an insulating substrate 2 so that the conductive paste 16 is added to the end portion of a brazing material 8-2. As with Example 1, a solder resist 11 is formed on a metal base 3. An end portion 16e of the conductive paste 16 is positioned in the direction of the side surface of the insulating substrate 2 with respect to an end portion 11e of the solder resist 11.

That is, when the distance between an end portion 16e of the conductive paste 16 and the downward extended line of the side surface of the insulating substrate 2 is taken as "a", and the distance between the end portion 11e of the solder resist 11 and the downward extended line of the side surface of the insulating substrate 2 is taken as "b", the positional relationship (a<b) is satisfied.

The region between a solder 9-2 and the conductive paste 16 has a narrow width, whereby a void 10 may be formed in the region. However, as with Example 1, the upper and lower portions of the void 10 are sandwiched between the conductive paste 16 and the solder 9-2 having the same GND potential, whereby no voltage is applied to the void 10.

Therefore, even when the void 10 is formed, corona discharge at the place can be suppressed, and in Example 6, the same effect as that of Example 1 can be obtained.

The conductive paste 16 in Example 6 can also be applied to Examples 2 to 4.

Example 7

Next, Example 7 will be described.

Figure 7:
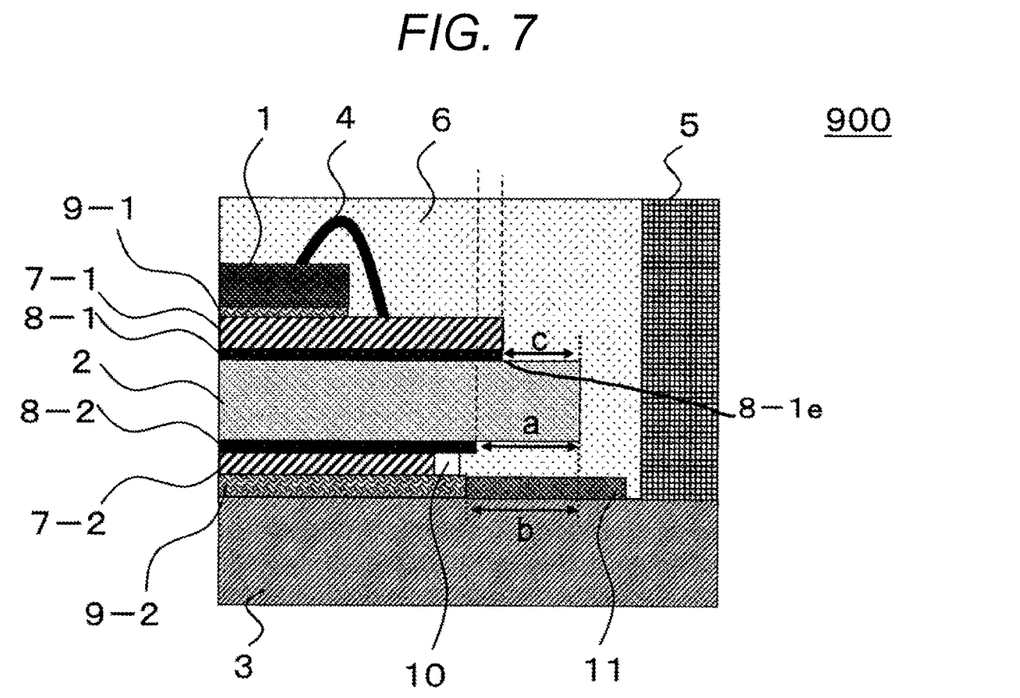
FIG. 7 illustrates a power semiconductor module according to Example 7.

FIG. 7 is a diagram illustrating the main part of a power semiconductor module 900 according to Example 7.

In FIG. 7, in the power semiconductor module 900 of Example 7, an end portion 8-1e of a brazing material 8-1 bonding an insulating substrate 2 and an insulating substrate front surface electrode 7-1 protrudes to the direction of the side surface of the insulating substrate 2 with respect to the position of an end portion 8-2e of a brazing material 8-2 bonding the insulating substrate 2 and an insulating substrate back surface electrode 7-2 as compared with the power semiconductor module 300 of Example 1. The other configurations in Example 7 are substantially the same as those in Example 1.

When the distance between the end portion 8-1e of the brazing material 8-1 and the upper extended line of the side surface of the insulating substrate 2 is taken as "c", the relationships c<a and a<b are satisfied (c<a<b). That is, the difference c between the position in the lateral direction of the end portion 8-1e of the front surface brazing material 8-1 and the position in the lateral direction of the end portion 2e of the insulating substrate 2 is smaller than the difference between the position in the lateral direction of the end portion 8-2e of the back surface brazing material 8-2 and the position in the lateral direction of the end portion 2e of the insulating substrate 2.

An electric field increases at the end portion of the brazing material 8-1 bonding the insulating substrate 2 and the insulating substrate front surface electrode 7-1 in the power semiconductor module 900, whereby dielectric breakdown is apt to occur at the place as the starting point of dielectric breakdown.

The electric field at the place can be reduced by increasing the distance between the place and the GND.

In Example 7, by shifting the end portion 8-2e of the brazing material 8-2 (GND potential) to the center side (the left side in FIG. 7) of the insulating substrate 2, the distance between the end portion 8-1e of the brazing material 8-1 and the GND is increased to alleviative the electric field at the place, thereby improving insulation resistance.

The positional relationship between the brazing material 8-2 and a solder 9-2 is the same as that in Example 1, and the end portion 8-2e of the brazing material 8-2 protrudes to the direction of the side surface of the insulating substrate 2 with respect to an end portion 11e of a solder resist 11. Accordingly, even when a void 10 occurs between the solder 9-2 and the insulating substrate 2, corona discharge at the place can be suppressed.

The configuration of Example 7 makes it possible to realize the power semiconductor module 900 which has improved insulation capability and suppresses corona discharge in a void below the insulating substrate.

Example Different from the Present Invention

Figure 9:
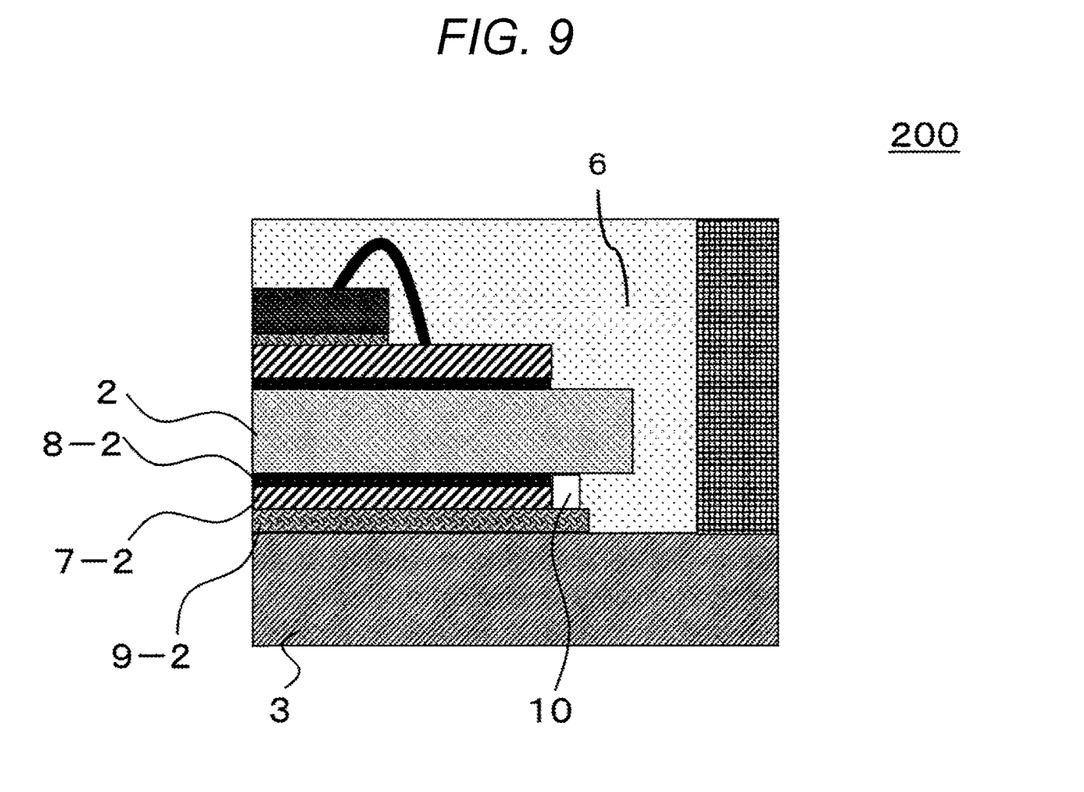
FIG. 9 is a diagram illustrating the configuration example of a power semiconductor module when the present invention is not applied, for comparison with the present invention.

FIG. 9 is a diagram illustrating the configuration example of a power semiconductor module 200 when the present invention is not applied, for comparison with the present invention.

In FIG. 9, a solder 9-2 for bonding a back surface electrode 7-2 of an insulating substrate 2 and a metal base 3 wets and spreads in the direction of the side surface direction of the insulating substrate 2. The distance between the insulating substrate 2 and the metal base 3 is as narrow as about 500 μm, and the region between the insulating substrate 2 and the solder 9-2 has a narrower width.

Therefore, the insulating substrate 2 and the solder 9-2 face each other in the vicinities of the end portions of both the insulating substrate 2 and the solder 9-2, and a silicone gel 6 as an insulating resin is not filled between the insulating substrate 2 and the solder 9-2, whereby a void 10 occurs. The potential of the solder 9-2 is a ground potential, and the insulating substrate 2 is not a ground substrate, whereby corona discharge may occur in the void 10.

On the other hand, even if the void 10 occurs between the brazing material 8-2 and the solder 9-2 in Examples 1 to 7, as described above, both the brazing material 8-2 and the solder 9-2 have the ground potential, whereby the occurrence of corona discharge in the void 10 can be suppressed.

The solder resist 11, the metal oxide film 12, the non-plated portion 13, and the metal base recessed portion 14 can be collectively referred to as a solder flow resistance portion.

What is claimed is:

1. A power semiconductor module comprising:
   an insulating substrate;
   a front surface electrode and a back surface electrode respectively fixed to a front surface and a back surface of the insulating substrate with a front surface brazing material interposed between the front surface electrode and the insulating substrate and a back surface brazing material interposed between the back surface electrode and the insulating substrate;
   a power semiconductor chip connected to the front surface electrode with a front surface solder interposed between the power semiconductor chip and the front surface electrode;
   a back surface solder formed on a side of the back surface electrode opposite to a side facing the back surface of the insulating substrate;
   a metal base on which the back surface solder is disposed to fix the back surface electrode with the back surface solder interposed between the metal base and the back surface electrode;
   a solder flow resistance portion formed on a surface of the metal base on which the back surface solder is disposed;
   an insulating case housing the insulating substrate, the front surface electrode, the back surface electrode, the power semiconductor chip, and the metal base; and
   an insulating resin filled in the insulating case,
   wherein, the front surface solder, the front surface electrode, the front surface brazing material, the insulating substrate, the back surface brazing material, the back surface electrode, and the back surface solder are stacked in a vertical direction,
       wherein a difference between a position in a lateral direction of an end portion of the back surface brazing material and a position in a lateral direction of an end portion of the insulating substrate is smaller than a difference between a position in the lateral direction of an end portion of the back surface solder and the position in the lateral direction of the end portion of the insulating substrate, and
       wherein the difference between the position in the lateral direction of the end portion of the back surface solder and the position in the lateral direction of the end portion of the insulating substrate is smaller than a difference between a position in the lateral direction of an end portion of the back surface electrode and the position in the lateral direction of the end portion of the insulating substrate.

2. The power semiconductor module according to claim 1, wherein
   a difference between a position in a lateral direction of an end portion of the front surface brazing material and the position in the lateral direction of the end portion of the insulating substrate is smaller than the difference between the position in the lateral direction of the end portion of the back surface brazing material and the position in the lateral direction of the end portion of the insulating substrate.

3. The power semiconductor module according to claim 1, wherein the position in the lateral direction of the end portion of the insulating substrate is located between both end portions of the solder flow resistance portion in the lateral direction.

4. The power semiconductor module according to claim 1, wherein the solder flow resistance portion is a solder resist.

5. The power semiconductor module according to claim 4, wherein
a difference between a position in a lateral direction of an end portion of the front surface brazing material and the position in the lateral direction of the end portion of the insulating substrate is smaller than the difference between the position in the lateral direction of the end portion of the back surface brazing material and the position in the lateral direction of the end portion of the insulating substrate.

6. The power semiconductor module according to claim 1, wherein the solder flow resistance portion is a metal oxide film.

7. The power semiconductor module according to claim 6, wherein
a difference between a position in a lateral direction of an end portion of the front surface brazing material and the position in the lateral direction of the end portion of the insulating substrate is smaller than the difference between the position in the lateral direction of the end portion of the back surface brazing material and the position in the lateral direction of the end portion of the insulating substrate.

8. The power semiconductor module according to claim 1, wherein
the solder flow resistance portion is a non-plated portion.

9. The power semiconductor module according to claim 8, wherein
a difference between a position in a lateral direction of an end portion of the front surface brazing material and the position in the lateral direction of the end portion of the insulating substrate is smaller than the difference between the position in the lateral direction of the end portion of the back surface brazing material and the position in the lateral direction of the end portion of the insulating substrate.

10. The power semiconductor module according to claim 1, wherein
the solder flow resistance portion is a metal base recessed portion.

11. The power semiconductor module according to claim 10, wherein the position in the lateral direction of the end portion of the insulating substrate is located between both end portions of the solder flow resistance portion in the lateral direction.

12. The power semiconductor module according to claim 10, wherein
a difference between a position in a lateral direction of an end portion of the front surface brazing material and the position in the lateral direction of the end portion of the insulating substrate is smaller than the difference between the position in the lateral direction of the end portion of the back surface brazing material and the position in the lateral direction of the end portion of the insulating substrate.

13. The power semiconductor module according to claim 12, wherein the position in the lateral direction of the end portion of the insulating substrate is located between both end portions of the solder flow resistance portion in the lateral direction.

* * * * *